United States Patent
Breeden et al.

(10) Patent No.: US 12,027,488 B2
(45) Date of Patent: Jul. 2, 2024

(54) METHODS OF FORMING STACKED INTEGRATED CIRCUITS USING SELECTIVE THERMAL ATOMIC LAYER DEPOSITION ON CONDUCTIVE CONTACTS AND STRUCTURES FORMED USING THE SAME

(71) Applicants: The Regents of the University of California, Oakland, CA (US); Georgia Tech Research Corporation, Atlanta, GA (US); Wayne State University, Detroit, MI (US)

(72) Inventors: Mike Breeden, La Jolla, CA (US); Victor Wang, La Jolla, CA (US); Andrew Kummel, La Jolla, CA (US); Ming-Jui Li, Atlanta, GA (US); Muhannad Bakir, Atlanta, GA (US); Jonathan Hollin, Albany, NY (US); Nyi Myat Khine Linn, Detroit, MI (US); Charles H. Winter, Bloomfield Hills, MI (US)

(73) Assignees: The Regents of the University of California, Oakland, CA (US); Wayne State University, Detroit, MI (US); Georgia Tech Research Corporation, Atlanta, GA (US)

( * ) Notice: Subject to any disclaimer, the term of this patent is extended or adjusted under 35 U.S.C. 154(b) by 371 days.

(21) Appl. No.: 17/470,630

(22) Filed: Sep. 9, 2021

(65) Prior Publication Data
US 2022/0077104 A1 Mar. 10, 2022

Related U.S. Application Data

(60) Provisional application No. 63/076,178, filed on Sep. 9, 2020.

(51) Int. Cl.
H01L 23/00 (2006.01)

(52) U.S. Cl.
CPC .............. H01L 24/82 (2013.01); H01L 24/24 (2013.01); H01L 2224/24145 (2013.01);
(Continued)

(58) Field of Classification Search
CPC ..... H01L 2224/82108; H01L 2224/821; H01L 2224/80895; H01L 24/23–25;
(Continued)

(56) References Cited

U.S. PATENT DOCUMENTS

2005/0003650 A1* 1/2005 Ramanathan ........... H01L 24/11
257/E21.705
2006/0234473 A1* 10/2006 Wong .................. H01L 23/3157
438/455

(Continued)

OTHER PUBLICATIONS

Chen, F.C. et al., "System on Integrated Chips (SoIC™) for 3D Heterogeneous Integration," 2019 IEEE 69th Electronic Components and Technology Conference (ECTC), 2019, pp. 594-599, doi:10.1109/ECTC.2019.00095.
(Continued)

Primary Examiner — Kevin Parendo
(74) Attorney, Agent, or Firm — Stanek Lemon Crouse & Meeks, PA

(57) ABSTRACT

Methods of bonding and structures with such bonding are disclosed. One such method includes providing a first substrate with a first electrical contact; providing a second substrate with a second electrical contact above the first electrical contact, wherein an upper surface of the first electrical contact is spaced apart from a lower surface of the second electrical contact by a gap; and depositing a layer of selective metal on the lower surface of the second electrical contact and on the upper surface of the first electrical contact by a thermal Atomic Layer Deposition (ALD) process until
(Continued)

the gap is filled to create a bond between the first electrical contact and the second electrical contact.

20 Claims, 12 Drawing Sheets

(52) U.S. Cl.
CPC ............... *H01L 2224/24225* (2013.01); *H01L 2224/245* (2013.01); *H01L 2224/2511* (2013.01); *H01L 2224/82108* (2013.01); *H01L 2924/01027* (2013.01); *H01L 2924/01042* (2013.01); *H01L 2924/01044* (2013.01); *H01L 2924/01074* (2013.01)

(58) Field of Classification Search
CPC ... H01L 2224/23–255; H01L 2224/82–82986; H01L 2224/80001–80986; H01L 2225/06513; H01L 2224/81–81986; H01L 2224/16106
See application file for complete search history.

(56) References Cited

U.S. PATENT DOCUMENTS

| | | | |
|---|---|---|---|
| 2014/0225149 A1* | 8/2014 | Sabathil | ............... H01L 33/48 438/27 |
| 2022/0246575 A1* | 8/2022 | Mizuno | ............... B23K 20/233 |

OTHER PUBLICATIONS

Gao, Guilian et al., "Chip to Wafer Hybrid Bonding with Cu Interconnect: High Volume Manufacturing Process Compatibility Study," 2019 International Wafer Level Packaging Conference (IWLPC), 2019, pp. 1-9, doi:10.23919/IWLPC.2019.8913877.

Gao, Guilian et al., "Scaling Package Interconnects Below 20μm Pitch with Hybrid Bonding," 2018 IEEE 68th Electronic Components and Technology Conference, pp. 314-322.

Huang, Yan-Pin et al., "Demonstration and Electrical Performance of Cu—Cu Bonding at 150° C With Pd Passivation," IEEE Transactions On Electron Devices, vol. 62, No. 8, Aug. 2015, pp. 2587-2592.

Ingerly, D.B. et al., "Foveros: 3D Integration and the use of Face-to-Face Chip Stacking for Logic Devices," 2019 IEEE International Electron Devices Meeting (IEDM), 2019, pp. 19.6.1-19.6.4, doi: 10.1109/IEDM19573.2019.8993637.

Kerrigan, Melissa et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, vol. 29, 2017, pp. 7458-7466.

Li, Y. et al., "Introduction to 3D Microelectronic Packaging," In: Y. Li, D. Goyal (eds) 3D Microelectronic Packaging, Springer, 2017, pp. 1-15.

Munding, A. et al., "Cu/Sn Solid-Liquid Interdiffusion Bonding," In: Tan C. et al. (eds) Wafer Level 3-D ICs Process Technology, Integrated Circuits and Systems, © Springer Science/Business Media LLC 2008, pp. 141-170.

Shigetu, A. et al., "Direct Bonding of CMP-Cu Films by Surface Activated Bonding (SAB) Method," J. Mater. Sci. 40, 3149-3154, 2005, https://loi.org/10.1007/s10853-005-2677-1.

Tan, C.S. et al., "Cu—Cu Diffusion Bonding Enhyancement At Low Temperature by Surface Passivation Using Self-Assembled Monolayer of Alkane-Thiol," Apply. Phys. Lett. 95, 192108, 2009; https://doi.org/10.1063/1.3263154.

Wang, Liang et (Ral., "Direct Bond Interconnect (DBI®) for fine-pitch bonding in 3D and 2.5D Integrated Circuits," Pan Pacific Microelectronics Symposium, 2017, pp. 1-6.

Yang, S. et al., "Materials Merging Mechanism of Microfluidic Electroless Interconnection Process," Journal of Electrochemical Society, vol. 65, pp. D273-D281, doi: 10.1149/2.0441807.

* cited by examiner

| OXIDE WIDTH (μm) | PAD PITCH (μm) | BEFORE ALD (Ω) | AFTER ALD (Ω) |
|---|---|---|---|
| 20 | 30 | OPEN | 2.7 |
| 20 | 50 | OPEN | 2.6 |
| 20 | 100 | OPEN | 2.9 |
| 30 | 30 | - | 2.9 |
| 30 | 50 | OPEN | 3.2 |
| 30 | 100 | OPEN | 3.3 |
| 50 | 30 | OPEN | 5.5 |
| 50 | 50 | OPEN | 4.9 |
| 50 | 100 | OPEN | 3.8 |
| 80 | 30 | OPEN | 2.9 |
| 80 | 50 | OPEN | 3.3 |
| 80 | 100 | OPEN | 3.5 |
| 130 | 30 | OPEN | 5.6 |
| 130 | 50 | OPEN | - |
| 130 | 100 | OPEN | 2.7 |
| AVE | | OPEN | 3.55 |

FIG. 7

TOP SIDE OF Cu M1

BOTTOM SIDE OF Cu M2

TOP SIDE OF Cu M1

| ELEMENT | WEIGHT% | ATOMIC% |
|---|---|---|
| STK | 9.96 | 19.70 |
| COL | 22.95 | 21.64 |
| CUL | 67.09 | 58.67 |

BEFORE ALD

AFTER ALD (1,000 CYCLES)

METHODS OF FORMING STACKED INTEGRATED CIRCUITS USING SELECTIVE THERMAL ATOMIC LAYER DEPOSITION ON CONDUCTIVE CONTACTS AND STRUCTURES FORMED USING THE SAME

PRIORITY

The present application claims priority to U.S. Provisional Application No. 63/076,178, filed Sep. 9, 2020, entitled METHODS OF FORMING STACKED INTEGRATED CIRCUITS USING SELECTIVE DEPOSITION OF COBALT ON CONDUCTIVE INTERCONNECT CONTACTS, the content of which is hereby incorporated herein by reference in its entirety.

FIELD

The presently disclosed subject matter relates to the fields of semiconductors in general, and more particularly, to formation of bonding via a selective thermal atomic layer deposition process.

BACKGROUND

As Moore's Law slows down, 3D chip integration will play an important role in the next generation of electronics as recently demonstrated by Intel's Foveros and TSMC's System on Integrated Chips (SoIC) technologies. The three-dimensional (3D) integration technologies exhibit shorter routing distance between chips, thus decreasing the transmission latency and power consumption. The shorter interconnect distance afforded by 3D integrated circuit (IC) integration also decreases the size of the package/microsystem by bonding multiple chips vertically within the same footprint.

Bonding technology is one of the key building blocks for 3D integration and has evolved from board-level to chiplet-level bonding. Although the function of bonding has not changed, the smaller dimensions and material limitations have created significant challenges. For example, the semiconductor industry uses solder for flip-chip bonding and micro-bump bonding with Input/Output (I/O) pitches ranging from a few hundred micrometers to 50 micrometers. However, when the bump pitch scales to approximately less than 40 μm, the solder bumps can easily short with adjacent bumps during bonding because the bumps are melted. In addition, melted solder bumps can create unfavorable intermetallic compounds, which decreases the thermal-mechanical stability.

To address these challenges, prior work has explored Copper-Copper (Cu—Cu) direct bonding for fine pitch interconnects. In the past two decades, several Cu—Cu direct bonding methods have been developed using, for instance, self-assemble monolayer bonding, surface activation bonding, and passivation methods, etc. However, all these technologies mainly rely on thermo-compression related methods, which require either high temperatures, extreme surface planarity, high surface cleanliness, or large mechanical forces, all of which can cause difficult implementation for densely connected 3D IC stacks.

Another technology with dense bonding is hybrid bonding. This bonding method first performs direct bonding of the oxide that surrounds Cu pads and subsequently forms Cu bonding with a low temperature anneal (150 to 300° C.). The semiconductor industry has demonstrated sub-10 μm pitch hybrid bonding and has applied this technique to high-end semiconductor processes. However, hybrid bonding requires a sophisticated chemical mechanical polishing or planarization (CMP) process to create nanometer-scale smooth Cu pads across the whole wafer (i.e., eliminate dishing). In addition, the surface cleanliness requirements and tight alignment specifications may cause difficulties as the I/O pitches scale down to less than 1 μm.

SUMMARY

Embodiments according to the present invention can provide methods of bonding or forming interconnects between semiconductor components and semiconductor structures with such bonding or interconnects.

In some embodiment according to the invention, a method of bonding includes providing a first substrate with a first electrical contact; providing a second substrate with a second electrical contact above the first electrical contact, wherein an upper surface of the first electrical contact is spaced apart from a lower surface of the second electrical contact by a gap; and depositing a layer of selective metal on the lower surface of the second electrical contact and on the upper surface of the first electrical contact by a thermal Atomic Layer Deposition (ALD) process until the gap is filled to create a bond between the first electrical contact and the second electrical contact.

In some embodiment according to the invention, a method of forming an interconnect comprises: fabricating a first conductive layer on a first substrate; fabricating a silicon layer on top of the first conductive layer; fabricating a second conductive layer on a second substrate on top of the silicon layer; etching off the silicon layer between the first conductive layer and the second conductive layer to create a gap between an upper surface of the first conductive layer and a lower surface of the second conductive layer; and depositing a selective metal on the first conductive layer and the second conductive layer by a thermal ALD process until the gap is filled to create a seamless interconnection between the first conductive layer and the second conductive layer.

In some embodiment according to the invention, a structure comprises a first substrate with a first electrical contact and a second substrate with a second electrical contact above the first electrical contact on the first substrate. An upper surface of the first electrical contact on the first substrate is spaced apart from a lower surface of the second electrical contact on the second substrate by a gap. The structure also comprises a layer of selective metal deposited in the gap via a thermal ALD process to provide a seamless interconnection between the first electrical contact on the first substrate and the second electrical contact on the second substrate.

BRIEF DESCRIPTION OF THE DRAWINGS

FIG. 7 is a table of resistance measurement before and after Co ALD bonding using the process in FIGS. 6A-6C for different interconnect designs in some embodiments according to the invention.

DETAILED DESCRIPTION

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Figure 1A:
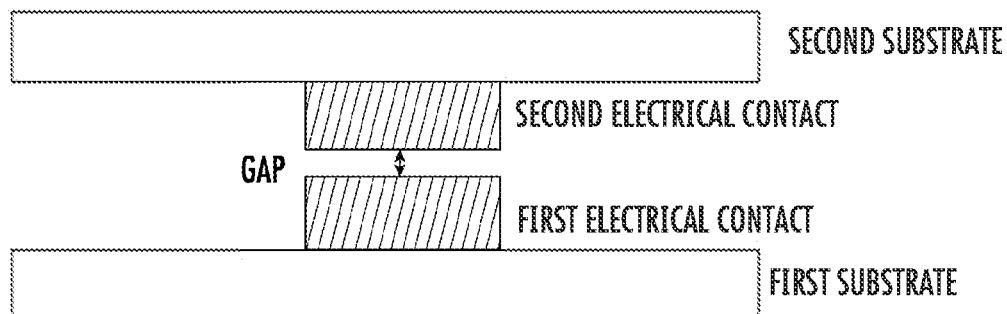
FIG. 1A illustrates a semiconductor structure before an ALD bonding process in some embodiments according to the invention.

The present disclosure provides a method of bonding in the microelectronics industry at low temperature (e.g., 200° C.) and with minimal surface pretreatment. The bonding can be between a chip and a chip, between multiple chips and multiple chips, between a chip and an interposer, between multiple chips and an interposer, between substrates, or any combination thereof, etc. The method can include providing a first substrate with a first electrical contact thereon and providing a second substrate with a second electrical contact thereon, above the first electrical contact. An upper surface of the first electrical contact is spaced apart from a lower surface of the second electrical contact by a gap as illustrated by FIG. 1A. The first substrate and the second substrate can be a wafer, an integrated circuit (IC) chip, or an interposer. In some embodiments according to the invention, the first electrical contact and the second electrical contact can include metal or a conductive material. For example, the first electrical contact and the second electrical contact can be Cu. The gap between the first substrate and the second substrate can be less than 1 μm. In some embodiments, the gap can be about 200 μm.

Figure 1B:
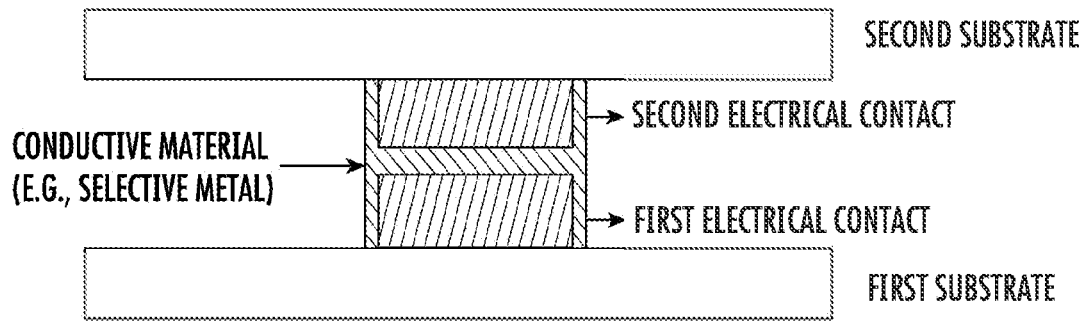
FIG. 1B illustrates a semiconductor structure after an ALD bonding process in some embodiments according to the invention.

The method can also include depositing a layer of selective metal on the lower surface of the second electrical contact and on the upper surface of the first electrical contact in the gap by a thermal ALD process until the gap is filled to create a bond between the first electrical contact and the second electrical contact, as illustrated by FIG. 1B. The deposition on the lower surface of the second electrical contact and the upper surface of the first electrical contact can occur essentially simultaneously (i.e., at the same time). The thermal ALD process does not require compression or mechanical force be applied between the first and second electrical contacts. Instead, a diffusion reaction can occur between a precursor gas carrying a constituent selective metal and the surfaces of both the first and second electrical contacts. Thus, a spacing from the first substrate and the second substrate can substantially be constant during the thermal ALD process. The selective metal can be deposited at an ambient temperature ranging between about 150 and about 300 degrees Centigrade. The selective metal (e.g., Cobalt (Co), Molybdenum (Mo), Ruthenium (Ru), or Tungsten (W)) can grow or deposit on the first and the second electrical contracts but avoid or substantially exclude other areas of the first and second substrates, especially when the substrates are of different material (e.g., silicon-based) from the electrical contacts.

In some embodiment, the first substrate or the second substrate includes more than one electrical contact. The more than one electrical contact is spaced apart between each other on the substrate by a pitch measured on-center. The pitch between the more than one electrical contact can be less than about 40 μm. In some embodiments, the pitch can be about 30 μm. In some embodiments according to the invention, the selective deposition of the metal may result in the metal not being deposited on some portion of the contacts, such as on the side walls.

In some embodiment, the selective thermal ALD process can deposit a layer of conductive material on certain surfaces of the electrical contacts in the gap until the gap is filled to provide a seamless interconnection between certain electrical contacts. The conductive material can be a selective metal that deposits on electrical contacts, but avoid areas (e.g., surfaces) of the substrates other than the electrical contacts.

The selective thermal ALD process in the present disclosure can be used to integrate 3D semiconductor structures. In some embodiments, the 3D semiconductor structure is a structure of stacked integrated circuits (ICs). The structure includes a first IC chip with at least one bonding contact and a second IC chip with at least one bonding contact. The second IC chip is stacked on top of the first IC chip. A layer of selective metal can be deposited by a thermal ALD process to seamlessly connect an upper surface of the at least one bonding contact on the first IC chip and a lower surface of the at least one bonding contact on the second IC chip. In some embodiments, the 3D semiconductor structure is an apparatus including a first chip device packaged in a package having at least one contact allowing for electrical connection to the first chip device and a second chip device packaged in a package having at least one contact allowing for electrical connection to the second chip device. The at least one contact of the first chip device and the at least one contact of the second chip device are bonded by a layer of selective metal that is deposited in between via a thermal ALD process.

In some embodiments, the methods described herein can be used to fabricate an electrical interconnect between the contact and substrates on which the contacts are formed. In some embodiments, the process can include fabricating a first conductive layer on a first substrate; fabricating a silicon layer on top of the first conductive layer; and fabricating a second conductive layer on a second substrate on top of the silicon layer. The first conductive layer can include about 150 nm of Cu and about 15 nm of Chromium (Cr). the second conductive layer can include about 1.5 µm of Cu and 15 nm of Titanium (Ti). The first conductive layer and the second conductive layer can include one or more than one bonding pad or pillar. The silicon layer can include about 200 nm of Silicon Dioxide.

The process also includes etching off the silicon layer between the first conductive layer and the second conductive layer to create a gap between an upper surface of the first conductive layer and a lower surface of the second conductive layer. The process also includes depositing a selective metal on the first conductive layer and the second conductive layer by a thermal ALD process until the gap is filled to create a seamless interconnection between the first conductive layer and the second conductive layer. The thermal ALD process can be repeated by a plurality of cycles before the gap is filled.

In some embodiments according to the invention, selective thermal Co ALD can be used to provide a high-density Cu—Cu interconnect bonding. In some embodiments, a Cu—Cu bonding method is provided for next-generation ultra-dense (e.g., <1 µm pitch) 3D integration. In some embodiments, a selective thermal ALD process is described for the formation of the I/O bonding.

Figure 2:
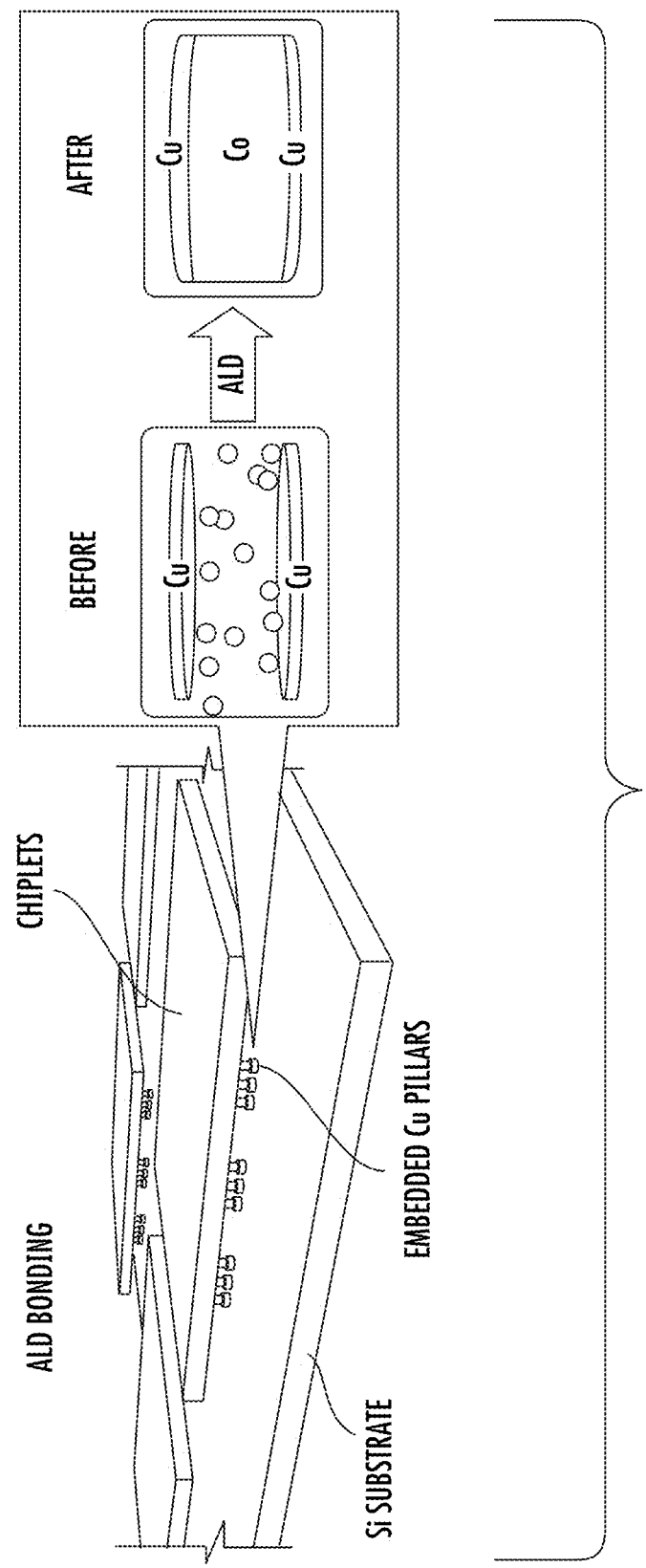
FIG. 2 illustrates an exemplary ALD bonding with multiple chiplets in some embodiments according to the invention.

FIG. 2 illustrates an exemplary ALD die bonding with multiple chiplets in some embodiments according to the invention. As shown in FIG. 2, the selective thermal ALD process in the present disclosure can deposit Co only between the Cu pads to form interconnections when two (or multiple) chips are stacked with small gaps. Once the ALD deposit grows to the thickness of the gap between the two dies, the Cu pads (or Cu pillars) become connected.

As appreciated by the present inventors, ALD offers several advantages for ultra-dense bonding. First, ALD can control film thicknesses to the angstrom level, which may bond the I/Os at a nanometer scale. Second, ALD bonding may not require extreme surface planarity (of the contacts) or cleanliness. Third, ALD bonding does not require external mechanical forces, which can help prevent die or wafer cracking. Fourth, ALD deposition may not be affected by the size of the contacts or pads, thereby enabling bonding of multi-diameter (contacts having different diameters or surface areas) and multi-pitch contacts or pads simultaneously. The present disclosure provides a method of using selective thermal Co ALD as high-density Cu—Cu interconnect bonding at low temperature (e.g., 200 Degrees Centigrade (° C.)) and with minimal surface pretreatment. In some embodiments, a Cu/Gap/Cu structure which emulates 3D ICs stacking is fabricated. In further embodiments, Co ALD can provide seamless interconnection between Cu pads with 30 µm pitch with over 90% yield through electrical measurements, Scanning Electron Microscopy (SEM) inspection, Energy dispersive X-ray spectroscopy (EDS) and focus ion beam (FIB) cross-section.

In some embodiments, a Cu—Cu bonding method can be utilized for next-generation ultra-dense (<1 µm pitch) 3D integration. In some embodiments, a selective thermal ALD process can be used for the formation of the I/Os. In some embodiments, the selective thermal ALD process can deposit Co between the Cu pads to form interconnections when two or more chips are stacked with small gaps between the substrates on which the Cu pads are formed. Once the ALD deposit grows to the thickness of the gap between the two dies, the Cu pads become connected.

In even further embodiments, selective Co ALD is performed a low deposition temperature (e.g., about 150 to about 300° C.), As appreciated by the present inventors, Co has inherent selectivity to Cu surfaces over Si-based surfaces, and also can provide low resistivity. In some embodiments, a Cu/200 nm gap/Cu 3D structure emulating 3D stacked ICs was fabricated to demonstrate the proposed ALD I/O bonding method. Using the thermal selective Co ALD process, a seamless interconnection was formed between pads with 30 µm pitch.

Figure 3:
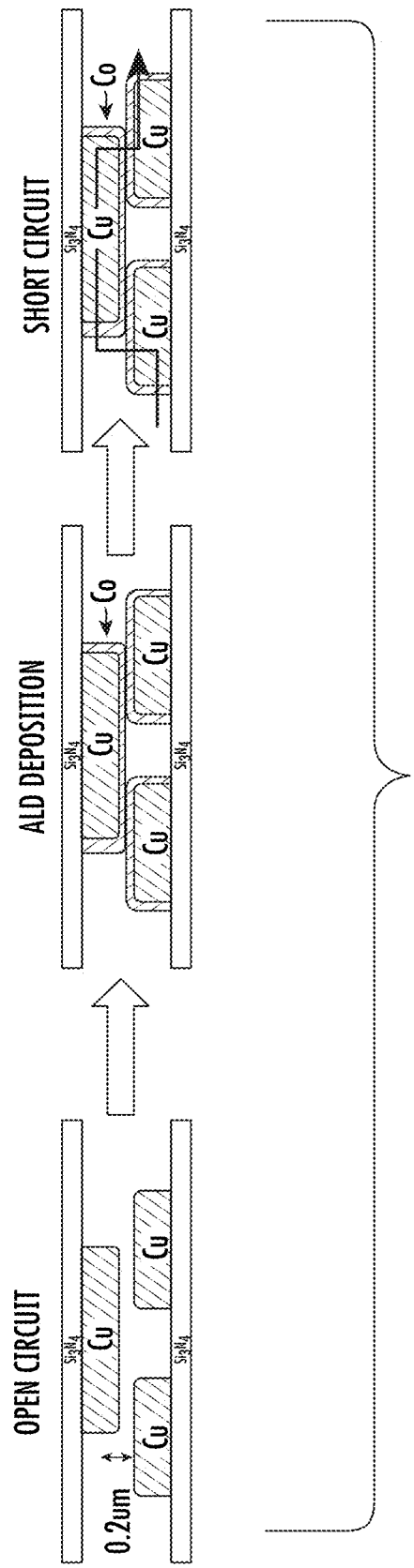
FIG. 3 is a schematic of Cobalt ALD bonding used for testing in some embodiments according to the invention.

FIG. 3 is a schematic of Cobalt ALD bonding test setup in some embodiments according to the invention. Before deposition, two chips are separated by a small gap to form an open circuit between the Cu pads. After undergoing a selective thermal ALD, the ALD deposit, which is Co in this case, grows only onto the Cu pads and gradually builds up from both surfaces until Co bonds to form the interconnections. By measuring the resistance before and after deposition, the result demonstrates the process functionality.

Figure 4A:
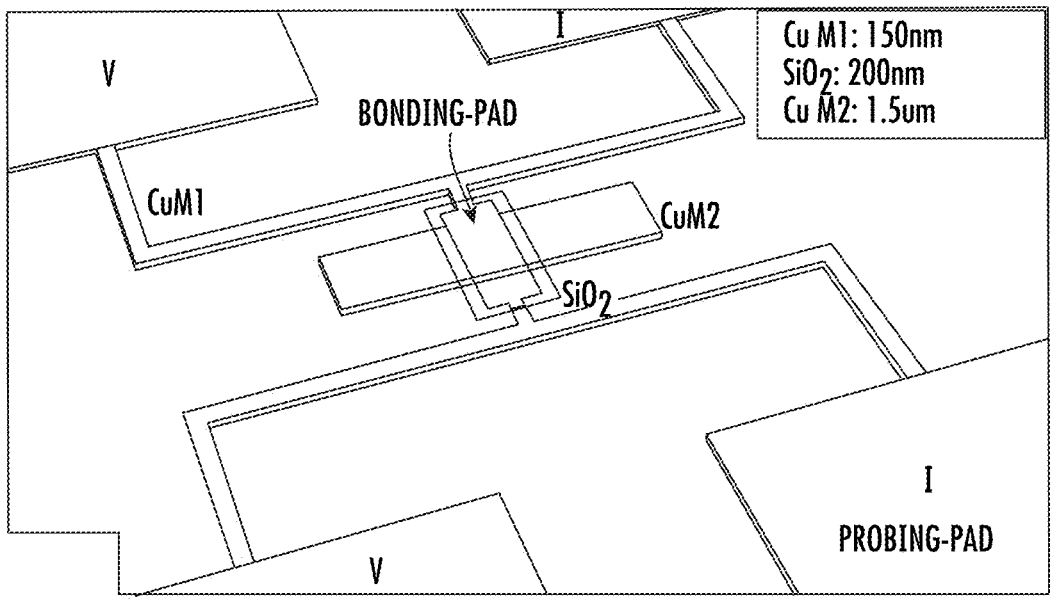
FIG. 4A illustrates a model of an ALD bonding testbed in some embodiments according to the invention.

FIG. 4A illustrates a model of an ALD bonding testbed in some embodiments according to the invention. In FIG. 4A, the first layer of Cu, M1, with 150 nm thickness, has two square-shaped bonding pads in the middle and four probing pads at periphery. The M1 layer is fabricated by a physical vapor deposition (PVD) lift-off process with 150 nm of Cu and 15 nm of Cr adhesion layer. At the M1 layer, each bonding pad is connected with two larger probing pads. The size of the probing pads is 200 µm×200 µm and the bonding pads are 20 µm×20 µm. By connecting the voltmeter and ammeter to the probing pads on each side, as shown in FIG. 4A, the four probing pads form a four-point-measurement structure to characterize the resistance of the bonding pads.

Figure 4B:
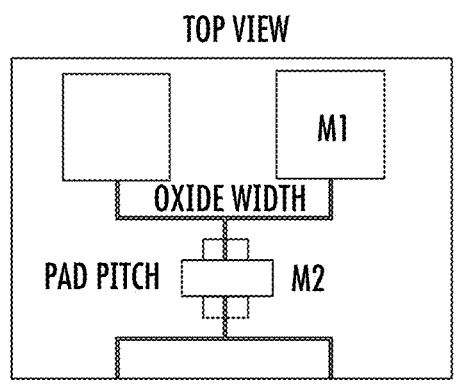
FIG. 4B is a top view of the model of the ALD bonding testbed in some embodiments according to the invention.
Figure 4C:
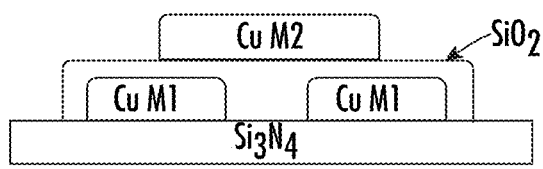
FIG. 4C illustrates a cross-section between bonding-pads in the 3D CAD model of the ALD bonding testbed in some embodiments according to the invention.
Figure 5:
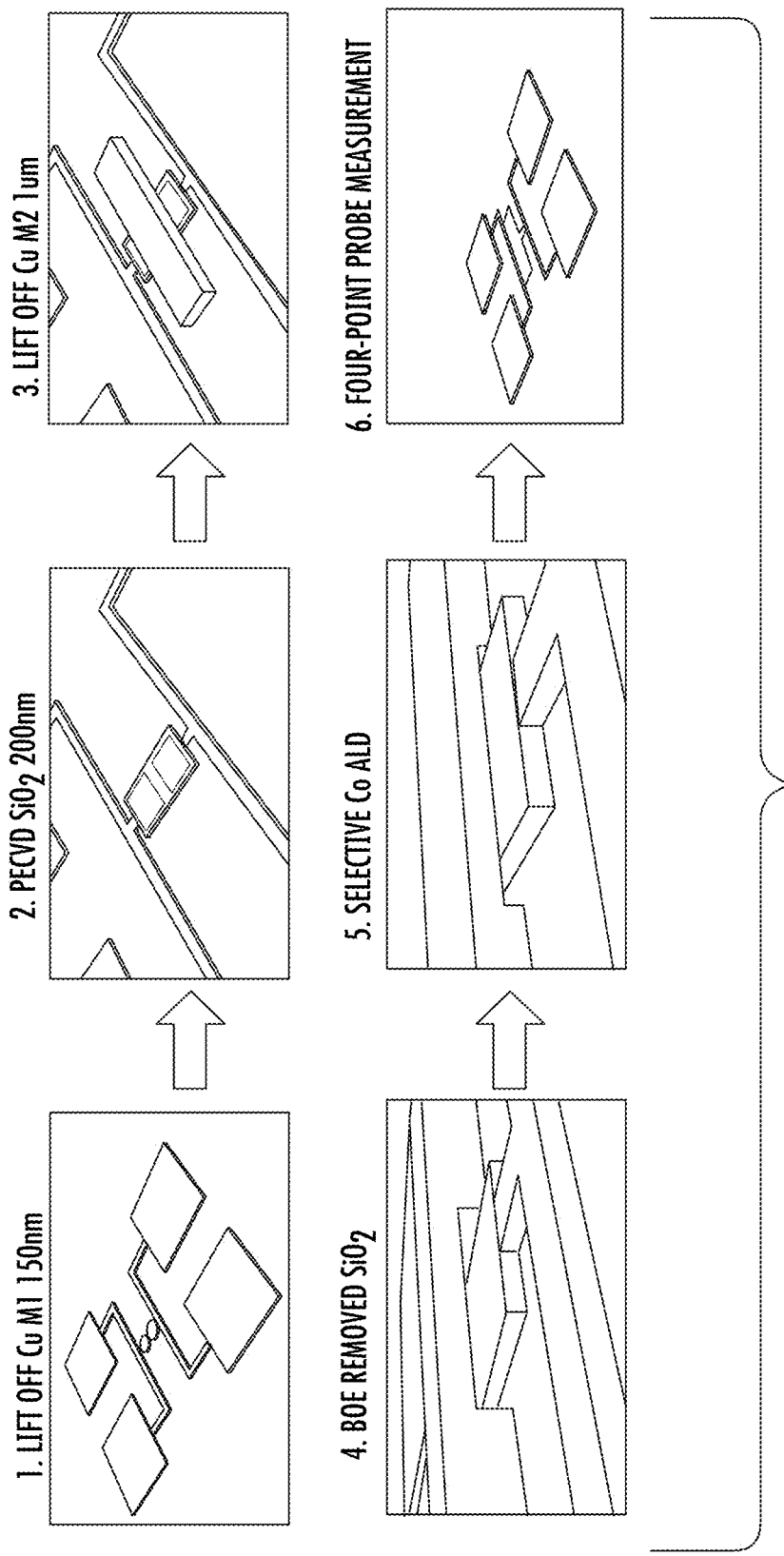
FIG. 5 illustrates a fabrication process using the testbed in FIG. 4 in some embodiments according to the invention.

FIG. 4B is a top view of the model of the ALD bonding testbed. In FIG. 4A. FIG. 4C illustrates a cross-section between bonding-pads in the model of the ALD bonding testbed. In FIG. 4C, the M1 bonding pads are covered with $SiO_2$ and the second layer of Cu, M2. The $SiO_2$ layer is 200 nm thick and is fabricated by plasma-enhanced chemical vapor deposition (PECVD). The M2 layer consists of 1.5 µm of Cu and 15 nm of a Ti adhesion layer, which are fabricated by a PVD lift-off process. $SiO_2$ is a sacrificial layer that would ultimately be etched away by buffered oxide etch (BOE) to create the gap between M1 and M2 layers before ALD deposition. FIG. 5 illustrates a fabrication process of the testbed in FIG. 4 in some embodiments according to the invention.

Figures 6A, 6B, 6C:
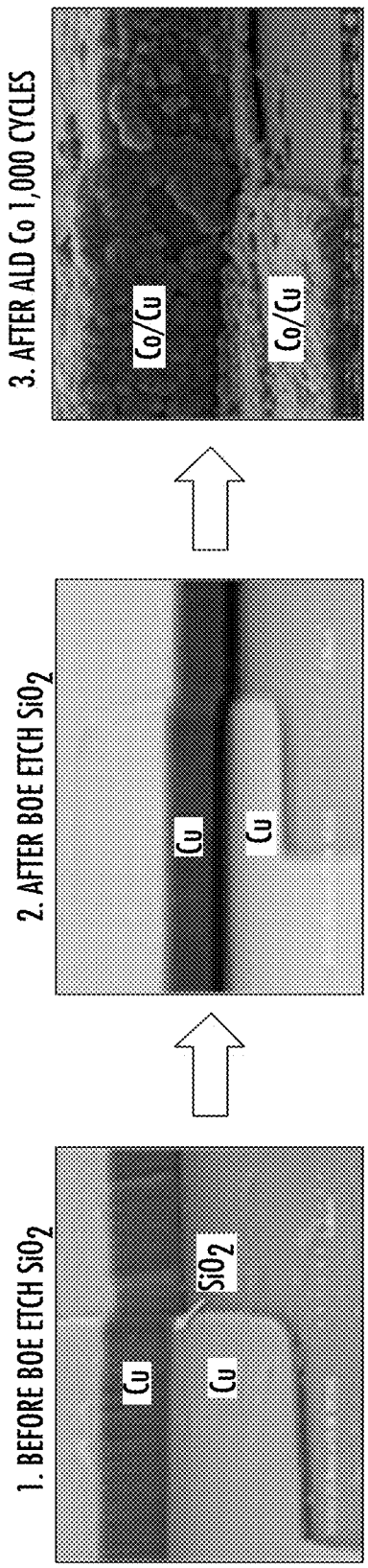
FIG. 6A is a Scanning Electron Microscopy (SEM) side view of the testbed in FIG. 4 before BOE etch $SiO_2$ sacrificial layer in some embodiments according to the invention
FIG. 6B is an SEM side view of the testbed in FIG. 4 after BOE etch $SiO_2$ to create a 200 nm gap between the layers in some embodiments according to the invention.
FIG. 6C is an SEM side view of the testbed in FIG. 4 after 1,000 cycles of Cobalt ALD deposition in some embodiments according to the invention.

A consistent 200 nm gap can be shown after etching the sample in BOE for 10 minutes. A single chip with multiple interconnect designs can then be placed in a thermal ALD system for Co deposition. Before the ALD deposition, samples are annealed at 350° C. under ultra-high vacuum (UHV) to remove residue. The subsequent ALD process steps are Co(DAD)2 (5.0 s)/turbomolecular pump down (10.0 s)/tert-butylamine (0.2 s)/turbomolecular pump down (10.0 s) at 200° C.; these steps are repeated for 1,000 cycles to fill the 200 nm gap in the testbed. Each cycle grows approximately 1 Å of Co in a period of approximately 50 seconds. However, in a commercial ALD tool, the process would be much faster. Note the use of pump down may be used for faster processing. When pump down is employed, the pressure difference between the outside of the chip or wafer and the space between the chips or wafers drives the transport, which may enable whole wafer bonding, in some embodiments. The detailed mechanism of Co ALD deposition and precursor is well established in the prior art. FIG. 6A is an SEM side view of the testbed in FIG. 4 before BOE etch $SiO_2$ sacrificial layer. FIG. 6B is an SEM side view of the testbed in FIG. 4 after BOE etch $SiO_2$ to create the 200 nm gap. FIG. 6C is an SEM side view of the testbed in FIG. 3 after 1,000 cycles of Co ALD deposition.

FIG. 7 is a table of resistance measurement before and after Co ALD bonding for different interconnect designs in some embodiments according to the invention. In the table, the resistance of each different interconnect design is compared before and after 1,000 cycles of Co ALD deposition to determine the change in electrical resistance. The average resistance after Co ALD deposition is 3.55 Ohm with a standard deviation of 1.07 Ohm and the calculated ideal resistance is 1.85 Ohm. The resistance measurement shows that the ALD Co bonding creates electrical pathways (e.g., interconnections) between M1 and M2 layers, and thus, eliminating the open circuit.

Figure 8A:
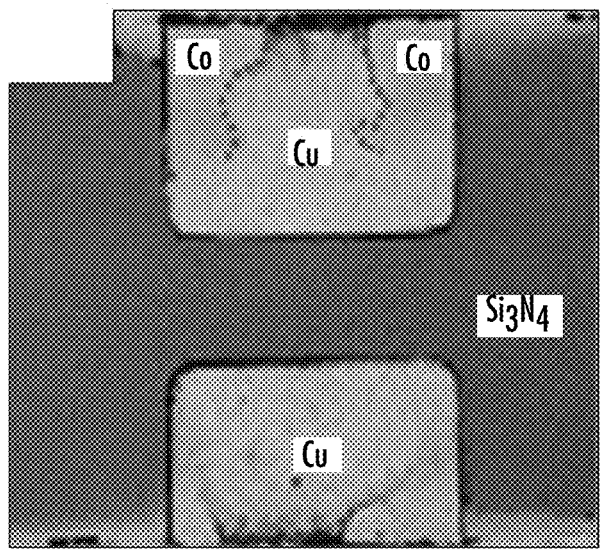
FIG. 8A is an optical microscope image of the top side of M1 layer after peeling off M2 layer from M1 layer in some embodiments according to the invention.
Figure 8B:
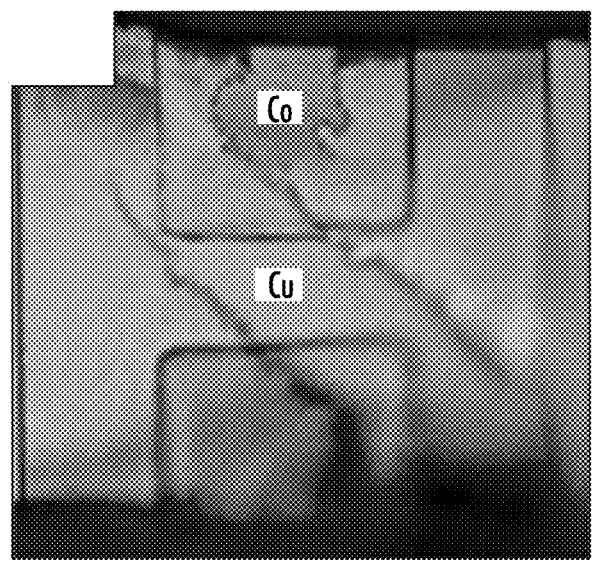
FIG. 8B is an optical microscope image of the bottom side of M2 layer after peeling off M2 layer from M1 layer in some embodiments according to the invention.

To gain visual access within the gap, Kapton tape was used to peel off the Cu M2 layer. Using an optical microscope, FIG. 8A shows the top side of Cu M1 layer, and FIG. 8B shows the bottom side of the Cu M2 layer. These two sides face each other inside the gap. The geometrical form of the Co deposit is marked with the dash lines. The boundary of Co in FIG. 8A matches the boundary of Co in FIG. 8B. Comparison of the shapes of Co between FIG. 8A and FIG. 8B appears to be consistent with a full layer of Co being filled inside the gap before M2 was peeled off. As shown in FIG. 8A, the bonding pads of Cu M1 layer are covered with Co deposit over the half of each pad.

Figure 9A:
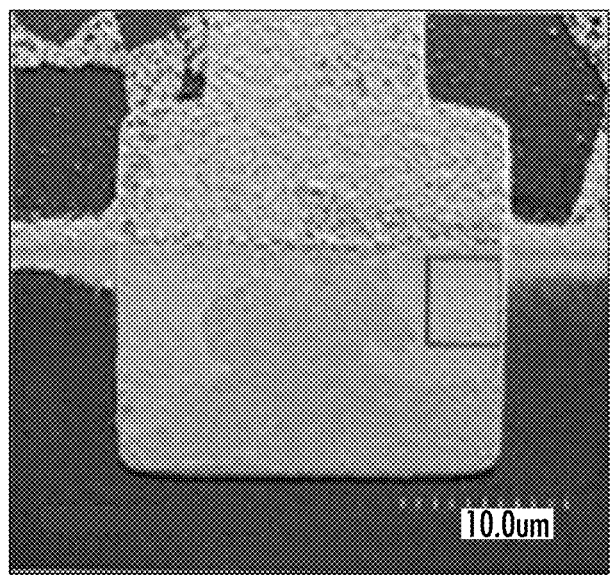
FIG. 9A illustrates SEM characteristics of the silver deposit on the bonding pad after ALD Co deposition for 1,000 cycles in some embodiments according to the invention.
Figure 9B:
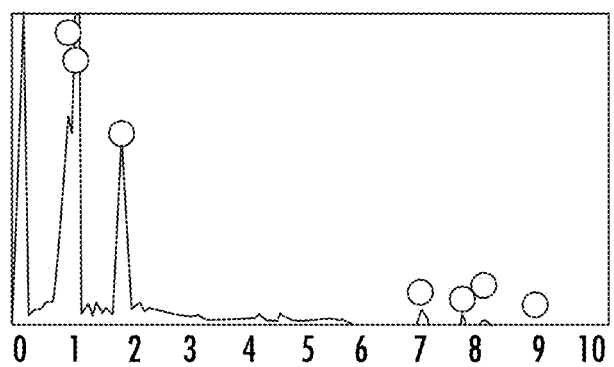
FIG. 9B illustrates Energy dispersive X-ray spectroscopy (EDS) characteristics of the silver deposit on the bonding pad after ALD Co deposition for 1,000 cycles in some embodiments according to the invention.

To confirm, the sample in FIG. 8A is characterized by SEM and EDS as shown in FIGS. 9A and 9B. FIG. 9A illustrates SEM characteristics of the silver deposit on the bonding pad after ALD Co deposition for 1,000 cycles. FIG. 9B illustrates EDS characteristics of the silver deposit on the bonding pad after ALD Co deposition for 1,000 cycles. EDS characterization of the surface chemistry can confirm the deposition of Co on the peeled pads.

Figure 10A:
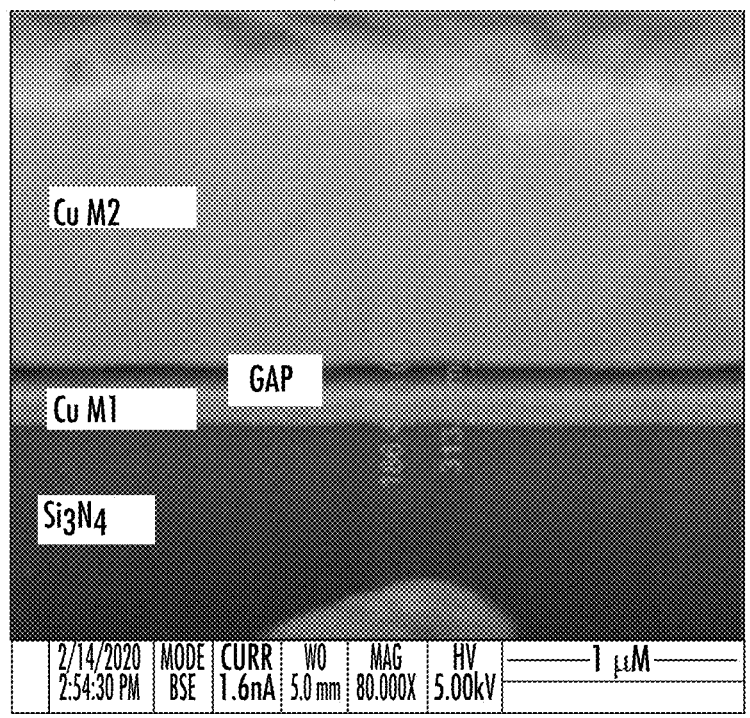
FIG. 10A illustrates focus ion beam (FIB) characteristics of a cross-section across the bonding pads before ALD in some embodiments according to the invention.
Figure 10B:
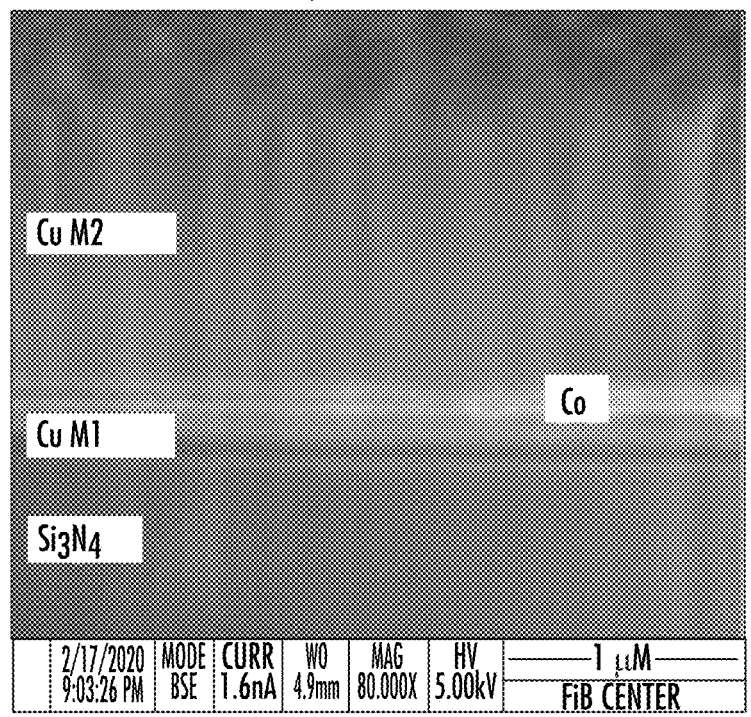
FIG. 10B illustrates FIB characteristics of the cross-section across the bonding pads after 1000 cycles of ALD in some embodiments according to the invention.

To investigate further, focus ion beam (FIB) sputtering was used to create a cross-section of the ALD-bonded pads and was observed under an SEM. FIG. 10A shows an approximately 200 nm gap prior to selective Co ALD deposition between the pads. FIG. 10B shows the gap between the Cu pads filled with Co ALD (after 1,000 cycles) to create a seamless interconnection between Cu M1 layer and Cu M2 layer.

Figure 11A:
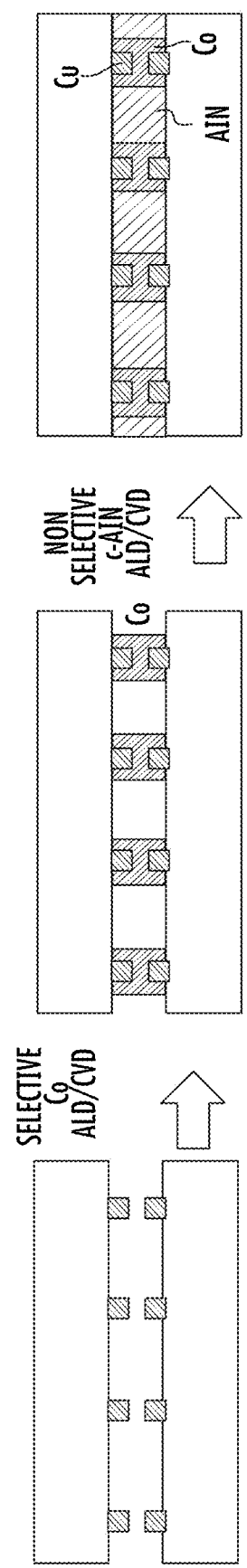
FIG. 11A illustrates methods of forming stacked integrated circuits using selective deposition of cobalt on conductive interconnect contacts of substrates using selective thermal ALD of Co onto spaced apart conductive contacts (such as Cu) to provide a Co layer on the conductive contacts in some embodiments.

FIG. 11A illustrates methods of forming stacked integrated circuits using selective deposition of cobalt on conductive interconnect contacts of substrates using selective thermal ALD of Co onto spaced apart conductive contacts (such as Cu) to provide a Co layer on the conductive contacts in some embodiments. As shown, the selective Co is substantially absent from surfaces of the substrates between the Co/conductive contacts. AN can then before formed on the surfaces of the substrates between the Co/conductive contacts using a non-selective ALD or CVD process in some embodiments.

Figure 11B:
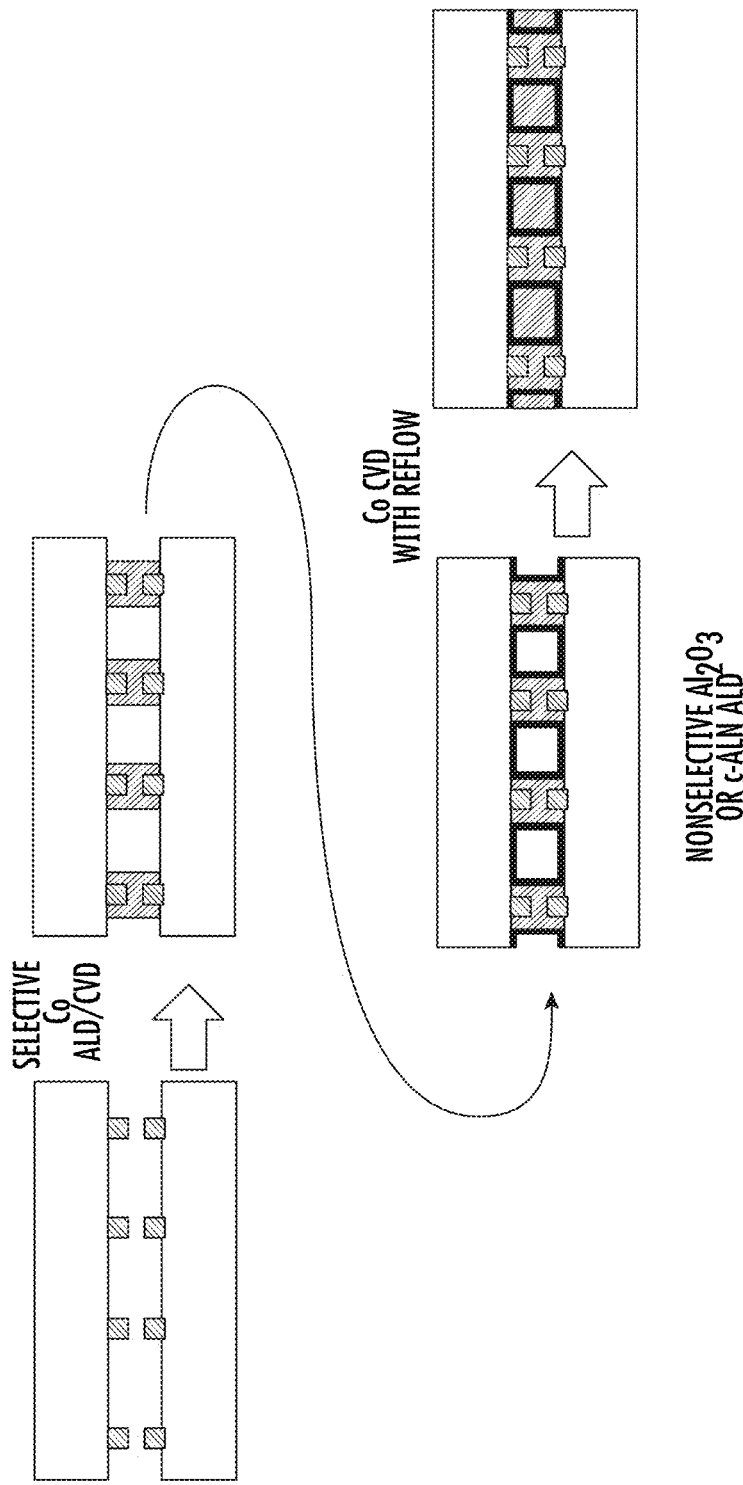
FIG. 11B illustrates methods of forming stacked integrated circuits using selective deposition of cobalt on conductive interconnect contacts of substrates using selective thermal ALD of Co onto spaced apart conductive contacts (such as Cu) to provide a Co layer on the conductive contacts in some embodiments.

FIG. 11B illustrates methods of forming stacked integrated circuits using selective deposition of cobalt on conductive interconnect contacts of substrates using selective thermal ALD of Co onto spaced apart conductive contacts (such as Cu) to provide a Co layer on the conductive contacts in some embodiments. As shown, the selective Co is substantially absent from surfaces of the substrates between the Co/conductive contacts. AN of $Al_2O_3$ can then before formed on the surfaces of the substrates between the Co/conductive contacts using a non-selective ALD or CVD process. Co can be formed using CVD between the Co/conductive/AlN or $Al_2O_3$ contacts in some embodiments.

As appreciated by the present inventors, embodiments according to the invention can utilize a ALD bonding without the otherwise required compressive force to provide metal diffusion to create the bond. In some embodiments, ALD bonding can deposit an intermediate layer between the conductive contacts (such as Cu pads). In contrast, bonding in some embodiments with selective thermal ALD is based on gas diffusion and gas surface reactions, which may enabling bonding at finer gaps and pitches than liquid phase precursors.

The present disclosure demonstrates ALD bonding between Cu pads. The selective Co thermal ALD process can be operated at low temperature (e.g., 200° C.). A Cu/200 nm Gap/Cu testbed was employed to emulate two chips stacked close together during bonding. By comparing the electrical resistance and FIB cross-sections before and after Co ALD deposition, Co ALD demonstrated over 90% yield and created a seamless interconnection within 200 nm gaps Cu gaps at 30 µm pitch.

while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

It will be understood that spatial terms, such as "above," "under," "lower," "upper," "top," "bottom," and "between," are relative in the present disclosure. In some embodiments, the term "providing" can include loading the substrate into a chamber.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

What is claimed:

1. A method of bonding, the method comprising:
providing a first substrate with a first electrical contact;
providing a second substrate with a second electrical contact above the first electrical contact, wherein an upper surface of the first electrical contact is spaced apart from a lower surface of the second electrical contact by a gap; and
depositing a layer of selective metal on the lower surface of the second electrical contact and on the upper surface of the first electrical contact in the gap by a thermal Atomic Layer Deposition (ALD) process until the gap is filled to create a bond between the first electrical contact and the second electrical contact.

2. The method of claim 1, wherein the thermal ALD process does not require compression or mechanical force applied between the first and second electrical contacts.

3. The method of claim 1, wherein a spacing from the first substrate and the second substrate is maintained within a predetermined tolerance range during the thermal ALD process.

4. The method of claim 1, wherein thermal ALD process creates a diffusion reaction between a precursor gas carrying a constituent of the selective metal and the upper and lower surfaces, respectively, of the first and second electrical contacts.

5. The method of claim 1, wherein the first substrate is a wafer.

6. The method of claim 1, wherein the first substrate is an Integrated Circuit (IC) chip.

7. The method of claim 1, wherein the first substrate is an interposer.

8. The method of claim 1, wherein the second substrate is a wafer.

9. The method of claim 1, wherein the second substrate is an Integrated Circuit (IC) chip.

10. The method of claim 1, wherein the second substrate is an interposer.

11. The method of claim 1, wherein the first electrical contact includes a metal.

12. The method of claim 1, wherein the first electrical contact includes copper.

13. The method of claim 1, wherein the second electrical contact includes a metal.

14. The method of claim 1, wherein the second electrical contact includes copper.

15. The method of claim 1, wherein depositing the layer further comprises depositing the selective metal at an ambient temperature ranging between 150 and 300 degrees Centigrade.

16. The method of claim 1, wherein the gap is less than 1 μm.

17. The method of claim 1, wherein the gap is 200 nm.

18. The method of claim 1, wherein the selective metal is at least one selected from a group consisting of Cobalt, Molybdenum, Ruthenium, and Tungsten.

19. A method of bonding, the method comprising:
providing a first substrate with a first electrical contact;
providing a second substrate with a second electrical contact above the first electrical contact of the first substrate, wherein an upper surface of the first electrical contact is spaced apart from a lower surface of the second electrical contact by a gap;
depositing a layer of conductive material on the first electrical contact and the second electrical contact by a selective thermal Atomic Layer Deposition (ALD) process until the gap is filled to create a seamless interconnection between the first electrical contact and the second electrical contact.

20. A method of bonding, the method comprising:
providing a first substrate with at least two electrical contacts spaced apart;
providing a second substrate with at least one electrical contact above the at least two electrical contacts of the first substrate, wherein an upper surface of the at least two electrical contacts is spaced apart from a lower surface of the at least one electrical contact by a gap;
depositing a layer of selective metal on the at least two electrical contacts of the first substrate and the at least one electrical contact of the second substrate by a thermal Atomic Layer Deposition (ALD) process until the gap is filled to create a seamless interconnection between the at least two electrical contacts of the first substrate and the at least one electrical contact of the second substrate.

* * * * *